United States Patent
Zhou

(10) Patent No.: US 11,031,315 B2
(45) Date of Patent: Jun. 8, 2021

(54) SEMICONDUCTOR STRUCTURE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/290,464

(22) Filed: Mar. 1, 2019

(65) Prior Publication Data
US 2019/0355646 A1    Nov. 21, 2019

(30) Foreign Application Priority Data

May 21, 2018  (CN) .......................... 201810489880.1

(51) Int. Cl.
| | |
|---|---|
| *H01L 29/66* | (2006.01) |
| *H01L 29/78* | (2006.01) |
| *H01L 23/373* | (2006.01) |
| *H01L 29/08* | (2006.01) |
| *H01L 29/16* | (2006.01) |

(Continued)

(52) U.S. Cl.
CPC ...... *H01L 23/3738* (2013.01); *H01L 29/0847* (2013.01); *H01L 29/1608* (2013.01); *H01L 29/66795* (2013.01); *H01L 29/785* (2013.01); *H01L 29/161* (2013.01); *H01L 29/201* (2013.01)

(58) Field of Classification Search
CPC ............. H01L 29/66795; H01L 29/785; H01L 27/0886; H01L 21/823431; H01L 23/3738
See application file for complete search history.

(56) References Cited

U.S. PATENT DOCUMENTS

| | | | |
|---|---|---|---|
| 9,837,408 B1* | 12/2017 | Bi | ........................ H01L 29/7851 |
| 2016/0027717 A1* | 1/2016 | Jang | ...................... H01L 27/092 361/718 |
| 2016/0359043 A1* | 12/2016 | Chen | ................ H01L 29/66795 |

(Continued)

*Primary Examiner* — Laura M Menz
*Assistant Examiner* — Khatib A Rahman
(74) *Attorney, Agent, or Firm* — Anova Law Group, PLLC

(57) ABSTRACT

A method for fabricating a semiconductor structure includes providing a substrate and forming a plurality of fins on a surface of the substrate. Along an extending direction of the fins, the fins include first regions, second regions, and gate structures across the second regions. The first regions are located at both sides of the second regions. The method also includes forming first openings in the fins by removing the first regions of the fins at both sides of the gate structures until the substrate is exposed. Further, the method includes forming thermal conductive layers in the first openings, and forming doped layers on top surfaces of the thermal conductive layers. A material of the fins has a first thermal conductivity, a material of the thermal conductive layers have a second thermal conductivity, and the second thermal conductivity is larger than the first thermal conductivity.

8 Claims, 8 Drawing Sheets

(51) Int. Cl.
*H01L 29/201* (2006.01)
*H01L 29/161* (2006.01)

(56) References Cited

U.S. PATENT DOCUMENTS

2017/0287977 A1* 10/2017 Moroz .................... H01L 35/10
2017/0330879 A1* 11/2017 Zhou ................... H01L 29/4925

* cited by examiner

SEMICONDUCTOR STRUCTURE AND FABRICATION METHOD THEREOF

CROSS-REFERENCES TO RELATED APPLICATIONS

This application claims priority of Chinese Patent Application No. 201810489880.1, filed on May 21, 2018, the entire contents of which are hereby incorporated by reference.

FIELD OF THE INVENTION

The present disclosure generally relates to the field of semiconductor technology and, more particularly, relates to semiconductor structures and fabrication techniques thereof.

BACKGROUND

With the continuous development of semiconductor technology, improvements of integrated circuit performances are mainly achieved by continuously reducing the sizes of integrated circuit devices to increase their speed. Currently, in pursuit of high component density, high performance, and low cost, semiconductor process techniques have advanced to the level of nanometer technology process nodes, and the fabrication of semiconductor devices is limited by various limitations of physics.

As CMOS devices continue to shrink, challenges from manufacturing and design have led to the development of three-dimensional designs such as fin field-effect transistors (FinFET). Compared with an existing planar transistor, the FinFET has superior performances in channel control and reducing shallow channel effects. In a planar transistor, a planar gate structure is disposed above a channel; while in a FinFET, a gate structure is disposed around a fin, and thus, static electricity of the FinFET may be controlled from three sides. Therefore, compared to a planar transistor, a FinFET may have a better control on its static electricity.

However, a self-heating effect of the FinFET fabricated by existing techniques may be serious. The disclosed methods and structures are directed to solve one or more problems set forth above and other problems in the art.

BRIEF SUMMARY OF THE DISCLOSURE

One aspect of the present disclosure includes a method for fabricating a semiconductor structure. The method includes providing a substrate and forming a plurality of fins on a surface of the substrate. Along an extending direction of the fins, the fins include first regions, second regions, and gate structures across the second regions. The first regions are located at both sides of the second regions. The method also includes forming first openings in the fins by removing the first regions of the fins at both sides of the gate structures until the substrate is exposed. Further, the method includes forming thermal conductive layers in the first openings, and forming doped layers on top surfaces of the thermal conductive layers. A material of the fins has a first thermal conductivity, a material of the thermal conductive layers have a second thermal conductivity, and the second thermal conductivity is larger than the first thermal conductivity.

Another aspect of the present disclosure includes a method for fabricating a semiconductor structure. The method includes providing a substrate and forming an isolation structure and a plurality of fins on a surface of the substrate. Along an extending direction of the fins, the fins include first regions, second regions, and gate structures across the second regions. The first regions are located at both sides of the second regions. A top surface of the isolation structure is lower than top surfaces of the fins, and the isolation structure covers a portion of sidewalls of the fins. The method also includes forming first openings in the fins by removing the first regions of the fins at both sides of the gate structures until the substrate is exposed. Further, the method includes forming second openings in the isolation structure by removing the portion of the isolation structure at the sidewalls of the first openings, wherein the second openings are connected with their corresponding first openings. Moreover, the method includes forming thermal conductive layers in the second openings, and forming doped layers on top surfaces of the thermal conductive layers. A material of the fins has a first thermal conductivity, a material of the thermal conductive layers have a second thermal conductivity, and the second thermal conductivity is larger than the first thermal conductivity.

Another aspect of the present disclosure includes a semiconductor structure. The semiconductor structure includes a substrate, and a plurality of fins formed on a surface of the substrate. Along an extending direction of the fins, the fins include first regions, second regions, and gate structures across the second regions. The first regions are located at both sides of the second regions. The semiconductor structure also includes first openings formed at the first regions located at both sides of the gate structures, wherein the bottoms of the first openings expose the surface of the substrate. The semiconductor structure further includes thermal conductive layers formed in the first openings, and doped layers formed on top surfaces of the thermal conductive layers. A material of the fins has a first thermal conductivity, a material of the thermal conductive layers have a second thermal conductivity, and the second thermal conductivity is larger than the first thermal conductivity.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

Figure 1:
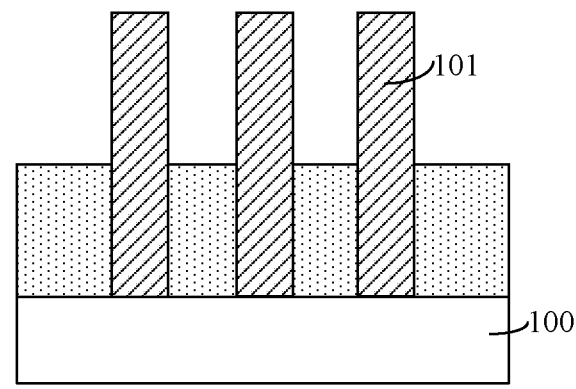
FIG. 1 illustrates a schematic structural view of an existing P-type fin field effect transistor.

FIG. 1 illustrates a schematic structural view of an existing P-type fin field effect transistor. As shown in FIG. 1, a P-type fin field effect transistor includes a substrate 100 and fins 101 formed on a surface of the substrate 100.

In the P-type fin field effect transistor, silicon germanium is used as a material of the fins 101 to increase the mobility of carriers in channel regions. However, a P-type fin field effect transistor may generate heat during a normal operation of the transistor. That is, a self-heating effect may occur in a P-type FinFET. The heat generated due to the self-heating effect is typically transferred from the fins 101 to the substrate 100, and is then released through the substrate 100 to outside environment. However, as silicon germanium has a poor thermal conductivity, the self-heating effect of the P-type fin field effect transistor is severe.

Moreover, as the integration degree of P-type fin field effect transistors continuously increases, the size of the fins 101 in the direction perpendicular to the extending direction the fins 101 continuously decreases. Therefore the capability of fins 101 to transfer the heat due to the self-heating effect becomes weak, and thus more heat may accumulate in the fin field effect transistor. In this case, the driving current of the fin field effect transistor may decrease, and the leakage current may become serious, and therefore the service life of the semiconductor device may be affected.

To solve the above technical problem, the present disclosure provides an improved method for fabricating semiconductor structures. For example, in this method, second regions of the fins at the bottom of gate structures are retained, and the material of first regions of the fins is replaced with thermal conductive layers. The thermal conductivity of the thermal conductive layer material is larger than the thermal conductivity of the fin material. Thus, this method may increase the carrier mobility in channel regions, and may also reduce the self-heating effect.

Figure 14:
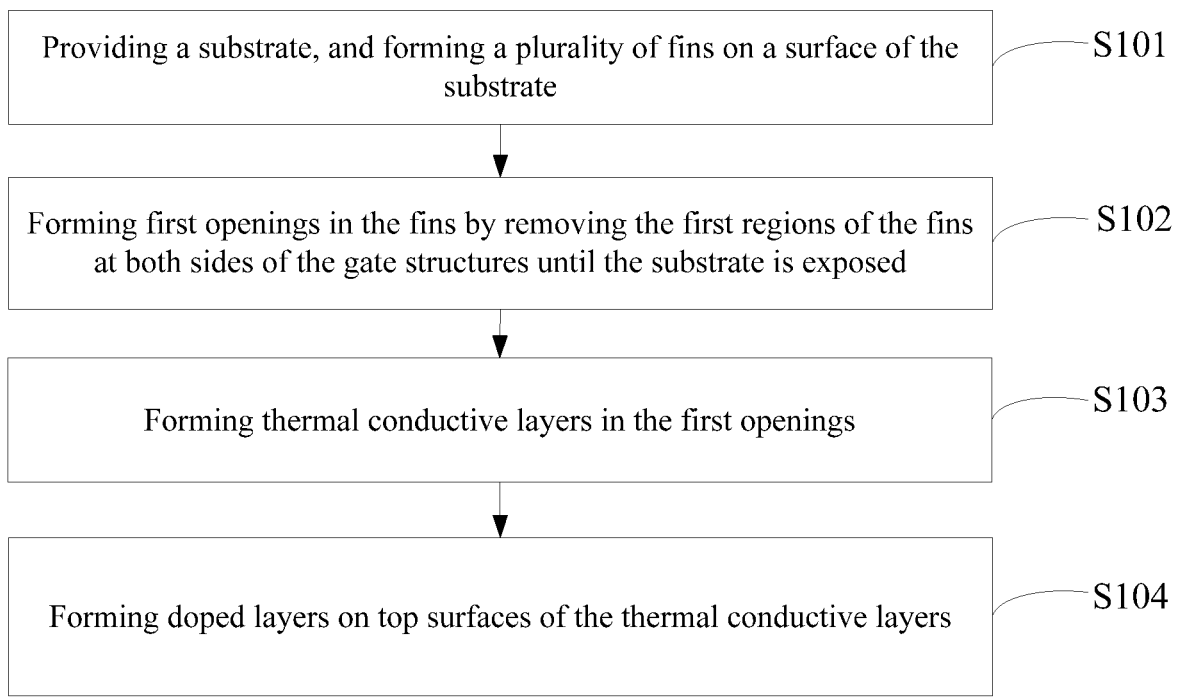
FIG. 14 illustrates an exemplary fabrication process of a semiconductor structure consistent with the disclosed embodiments.

FIG. 14 illustrates an exemplary fabrication process of a semiconductor structure consistent with the disclosed embodiments; and FIGS. 2 to 9 illustrate semiconductor structures corresponding to certain stages of the exemplary fabrication process.

Figure 2:
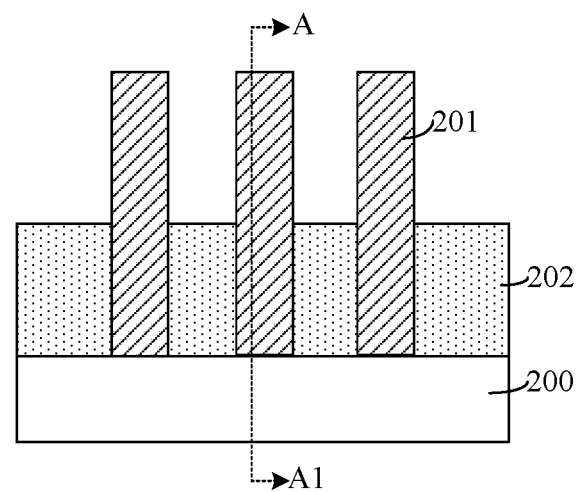
FIGS. 2 to 13 illustrate schematic structural views of semiconductor structures corresponding to certain stages of an exemplary fabrication process consistent with the disclosed embodiments.
Figure 3:
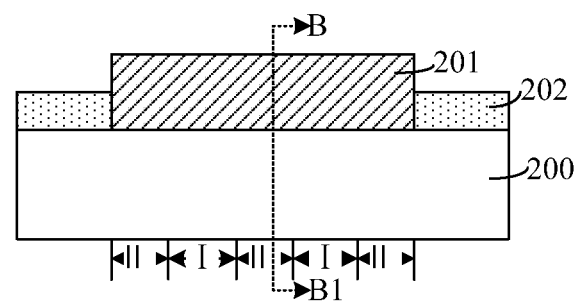

As shown in FIG. 14, at the beginning of the fabrication process, a semiconductor substrate with certain structures is provided (S101). FIG. 2 and FIG. 3 illustrate a corresponding semiconductor structure.

FIG. 3 is a schematic cross-sectional view along line A-A1 in FIG. 2, and FIG. 2 is a schematic cross-sectional view along line B-B1 in FIG. 3. The exemplary fabrication process includes providing a substrate 200, and fins 201 are formed on a surface of the substrate 200. Along the extending direction of the fins 201, there are second regions II and first regions I. The first regions are located at both sides of second regions II. The material of the fins 201 has a first thermal conductivity.

In one embodiment, the material of the substrate 200 is single crystal silicon. In some other embodiments, the material of the substrate 200 may be single crystal germanium, silicon germanium, or silicon carbide.

In one embodiment, the transistor to be formed is a PMOS transistor. To increase the mobility of carriers in channel regions of the PMOS transistor, silicon germanium is selected as the material of the fins 201.

In some other embodiments, the transistor to be formed may be an NMOS transistor. To increase the mobility of carriers in the channel regions of the NMOS transistor, a compound of a group III-V family element may be selected as the material of the fins 201. The compound of a group III-V family element includes indium gallium arsenide.

The formation of the fins 201 includes following main three steps. First, a layer of fin material is formed on a surface of the substrate 200. Second, a first mask layer (not shown) is formed on the top surface of the fin material layer, and the first mask layer exposes a portion of the top surface of the fin material layer. Third, the fin material layer is etched with the first mask layer as an etching mask, until the top surface of the substrate 200 is exposed, forming a plurality of fins 201 that are separated from each other.

In one embodiment, the transistor to be formed is a PMOS transistor, and the material of the fin material layer is silicon germanium. In other embodiments, the transistor may be an NMOS transistor, and the material of the fin material layer may include a compound of a group III-V element.

The forming process of the fin material layer includes an epitaxial growth process. As the fin material layer is formed by the epitaxial growth process, the thickness of the fin material layer may be controlled according to actual process requirements, and thus the controllability of the semiconductor device may be improved.

The material of the first mask layer includes silicon nitride or titanium nitride. The first mask layer may be used as a mask of the fins 201. By using the first mask layer as an etching mask, the process of etching the fin material layer includes one or a combination of a dry etching process and a wet etching process.

As shown in FIG. 3, in the extending direction of the fins 201, the fins 201 includes second regions II and first regions I, and the first regions I are located on both sides of the second regions II. In the etching process, the first regions I of fins 201 are removed, and the second regions II of the fins 201 are retained. Gate structures are formed across the second regions II of the fins 201, and the fins 201 may be used to increase the mobility of carriers in channel regions. Thermal conductive layers are formed at positions of the first regions I of the fins 201. As the thermal conductivity of the thermal conductive layers is larger than the first thermal conductivity of the fins 201, this configuration may reduce the self-heating effect of the transistor, and improves the performance of the device.

Further, there may be an isolation structure 202 on the surface of the substrate 200. The top surface of the isolation structure 202 is lower than the top surface of the fins 201, and the isolation structure 202 covers a portion of the sidewall of the fins 201.

The formation method of the isolation structure 202 includes following two main steps. First, an isolation structure film is formed on the surface of the substrate 200, and the sidewalls and top surfaces of the fins 201. Second, a part of the isolation structure film is removed, exposing the top portions and a part of the sidewalls of the fins, forming the isolation structure 202.

The material of the isolation structure film includes silicon oxide or silicon oxynitride. The forming process of the isolation structure film includes a fluid chemical vapor deposition process. The isolation structure film formed by the fluid chemical vapor deposition process may sufficiently fill the gap between the fins 201, and the isolation structure 202 formed may have a good isolation performance.

The process of removing a portion of the isolation structure film includes one or a combination of a dry etching process and a wet etching process.

Figure 4:
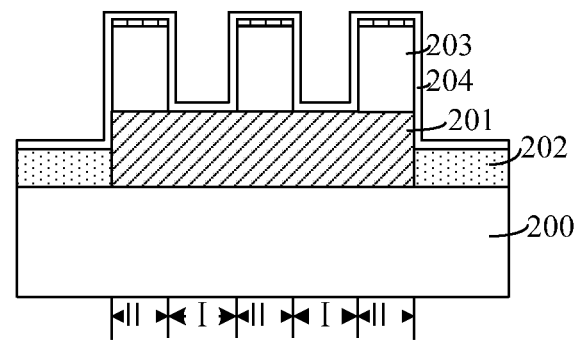

Referring to FIG. 4, gate structures 203 are formed across the second regions II of the fin 201. It should be noted that the cross-sectional direction of FIG. 4 is consistent with the cross-sectional direction of FIG. 3. The gate structures 203 covers the second regions II of the fin 201. The material of the fin 201 may improve the mobility of carriers in the channel regions, and thus may improve the performance of the semiconductor device.

A sidewall film 204 is formed on the surface of the isolation structure 202 and the top surfaces and sidewalls of the gate structures 203. The sidewall film 204 is used to subsequently form sidewalls. The material of the sidewall film 204 includes silicon nitride. The forming process of the sidewall film 204 includes an atomic layer deposition process or a chemical vapor deposition process.

Figure 5:
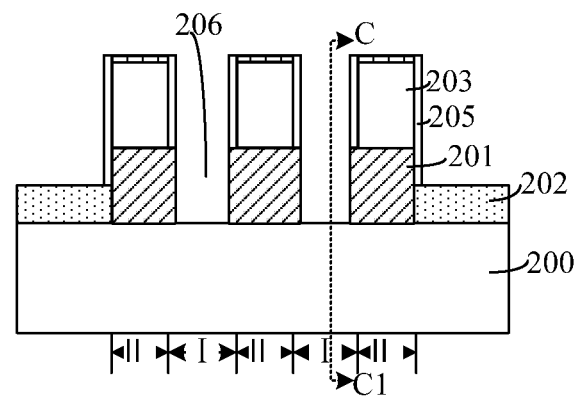
Figure 6:
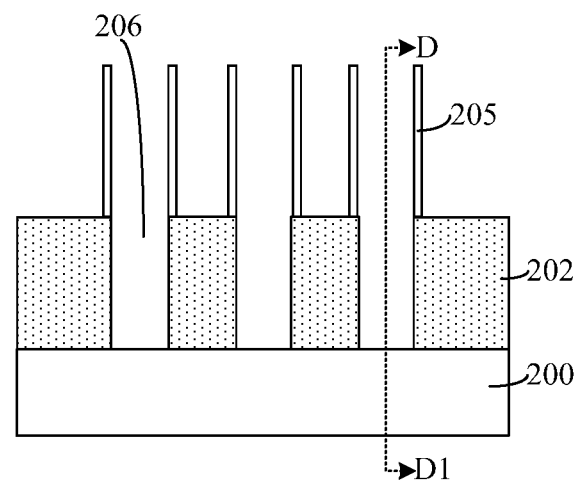

Returning to FIG. 14, after removing the first regions of the fins at both sides of the gate structures, first openings are formed in the fins (S102). FIG. 5 and FIG. 6 illustrate a corresponding semiconductor structure.

FIG. 6 is a cross-sectional view along C-C1 line in FIG. 5, and FIG. 5 is a cross-sectional view along D-D1 line in FIG. 6. By removing the sidewall film 204 at the top surfaces of the gate structures 203, the isolation structure 202, and the first regions I of the fins 201, sidewalls 205 are formed on the sides of the gate structures 203 and the sidewalls of the fins 201. The first regions I of the fins 201 at the both sides of the sidewalls 205 and gate structures 203 are removed, until the top surface of the substrate 200 is exposed, and first openings 206 are thus formed in the fins 201.

The process of removing the sidewall film 204 at the top surfaces of the gate structures 203, the isolation structure 202 and the fins 201 includes one or a combination of a dry etching process and a wet etching process.

The forming process of the first openings 206 includes one or a combination of a dry etching process and a wet etching process.

As the bottom surfaces of the first openings 206 expose the top surface of the substrate 200, the thermal conductive layer subsequently formed in the first openings 206 may directly contact the substrate 200. In this configuration, the heat generated by the operation of the semiconductor device may be transferred to the substrate 200 through the thermal conductive layer, and then transferred through the substrate 200 to the atmosphere. Therefore this configuration may reduce the self-heating effect.

The size of the first openings 206 along the extending direction of the fins 201 is in a range of approximately 8 nm to 20 nm. If the size of the first openings 206 along the extending direction of the fins 201 is less than 8 nm, as the width of the fins 201 is small, the thermal conductive layers subsequently formed in the first openings 206 have a small contact area with the substrate 200. In this case, the capability of the thermal conductive layers to transfer the heat, generated when the device operates, to the substrate 200 is weak. If the size of the first openings 206 in the extending direction of the fins 201 is larger than 20 nm, a portion of the second regions II of the fins 201 may be removed, and thus the subsequent thermal conductive layers may be located at the bottom of the gate structure 203. As the material of the thermal conductive layer may decrease the mobility of carriers in the channel region, the performance of the device may be affected.

The depth of the first openings 206 is in a range of approximately 800 angstroms to 3,000 angstroms.

Since the isolation structure 202 covers a portion of the sidewalls of the fins 201, the first openings 206 may expose the isolation structure 202 after the first openings 206 are formed.

Figure 7:
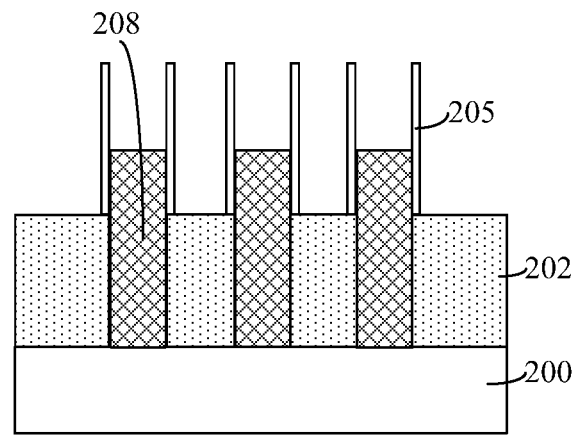

Referring to FIG. 7, thermal conductive material films 208 are formed in the first openings 206. The thermal conductive material films 208 have a second thermal conductivity, and the second thermal conductivity is larger than the first thermal conductivity.

In one embodiment, the material of the thermal conductive material films 208 is silicon. The forming process of the thermal conductive material films 208 includes an epitaxial growth process. In some other embodiments, the material of the thermal conductive material film may be silicon carbide.

In one embodiment, the thermal conductive material films 208 cover a portion of the surfaces of the sidewalls 205. The sidewalls 205 are used to limit the topography of the thermal conductive material films 208 during the epitaxial growth process.

The thermal conductive material films 208 are used for subsequently forming thermal conductive layers. As the second thermal conductivity of the thermal conductive layers is larger than the first thermal conductivity of the fins 201, the thermal conductive layers have a strong capability of transmitting the heat generated by the operation of the transistor to the substrate 200. Therefore, this configuration may reduce the self-heating effect of the transistor.

The thickness of the thermal conductive material films 208 is in a range of approximately 500 angstroms to 2000 angstroms.

Figure 8:
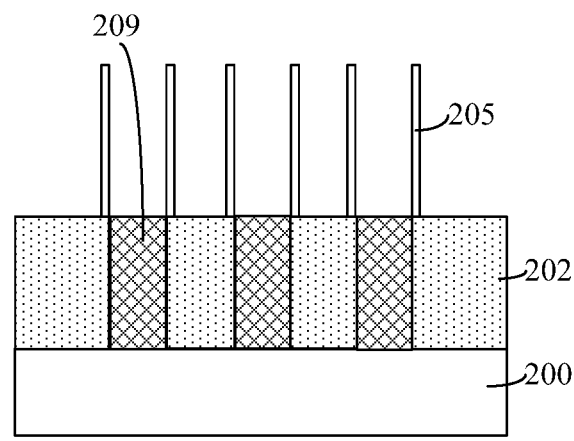

Returning to FIG. 14, after removing a portion of the thermal conductive material films 208, thermal conductive layers 209 are formed (S103). FIG. 8 illustrates a corresponding semiconductor structure.

The process of removing a portion of the thermal conductive material films 208 includes one or a combination of a dry etching process and a wet etching process.

As the thermal conductive layers 209 are formed from the thermal conductive material films 208, the thermal conductivity of the thermal conductive layers 209 is larger than the thermal conductivity of the fins 201, so the thermal conductive layers 209 have a strong capability to transfer the heat generated by the operation of the transistor. Therefore, this configuration may reduce the self-heating effect of the transistor, and improve the performance of the device.

The thickness of the thermal conductive layers 209 is in a range of approximately 500 angstroms to 2,000 angstroms. If the thickness of the thermal conductive layers 209 is less than 500 angstroms, the thermal conductive layer 209 may not have sufficient ability to transfer the heat generated by the transistor. In this case, the self-heating effect may be serious, and maybe the performance of the device cannot be improved. If the thickness of the heat conducting layers 209 is larger than 2,000 angstroms, to avoid the contact between subsequently formed adjacent doped layers, the volumes of the subsequently formed doped layers should be small. Therefore, the source/drain doped regions have a little stress on the carriers in the channel regions, and in this case, maybe the mobility of carriers cannot be improved.

In one embodiment, the top surfaces of the thermal conductive layers 209 are lower than the tops of the sidewalls 205 at the side of the first regions I of the fins 201. The sidewalls 205 at the top surfaces of the thermal conductive layers 209 may limit the morphology of the subsequent doped layers, so that the subsequent doping layers do not grow excessively. Therefore, the contact between adjacent doped layers may be avoided, and thus this configuration may improve the performance of the semiconductor device.

In some other embodiments, the top surfaces of the thermal conductive layers 209 may be higher than the tops of the sidewalls 205 at the side of the first regions I of the fin 201.

Figure 9:
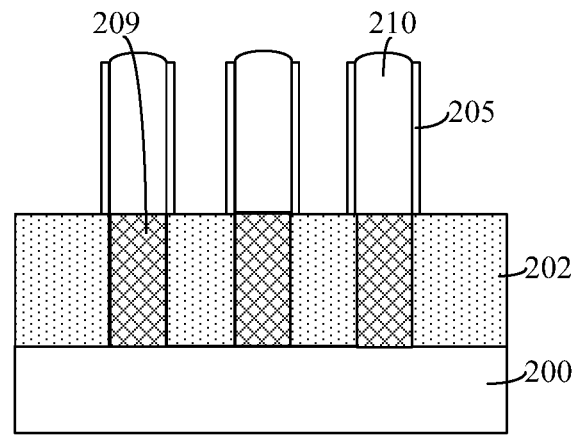

Returning to FIG. 14, doped layers 210 are formed on the top surfaces of thermal conductive layers 209 (S104). FIG. 9 illustrates a corresponding semiconductor structure.

As shown in FIG. 9, the topography of the doped layers 210 may be limited by the sidewalls 205. The forming process of the doped layers 210 includes forming epitaxial layers (not shown) on top surfaces of the thermal conductive layers 209, and doping source/drain ions into the epitaxial layers to form the doped layers 210.

Figure 15:
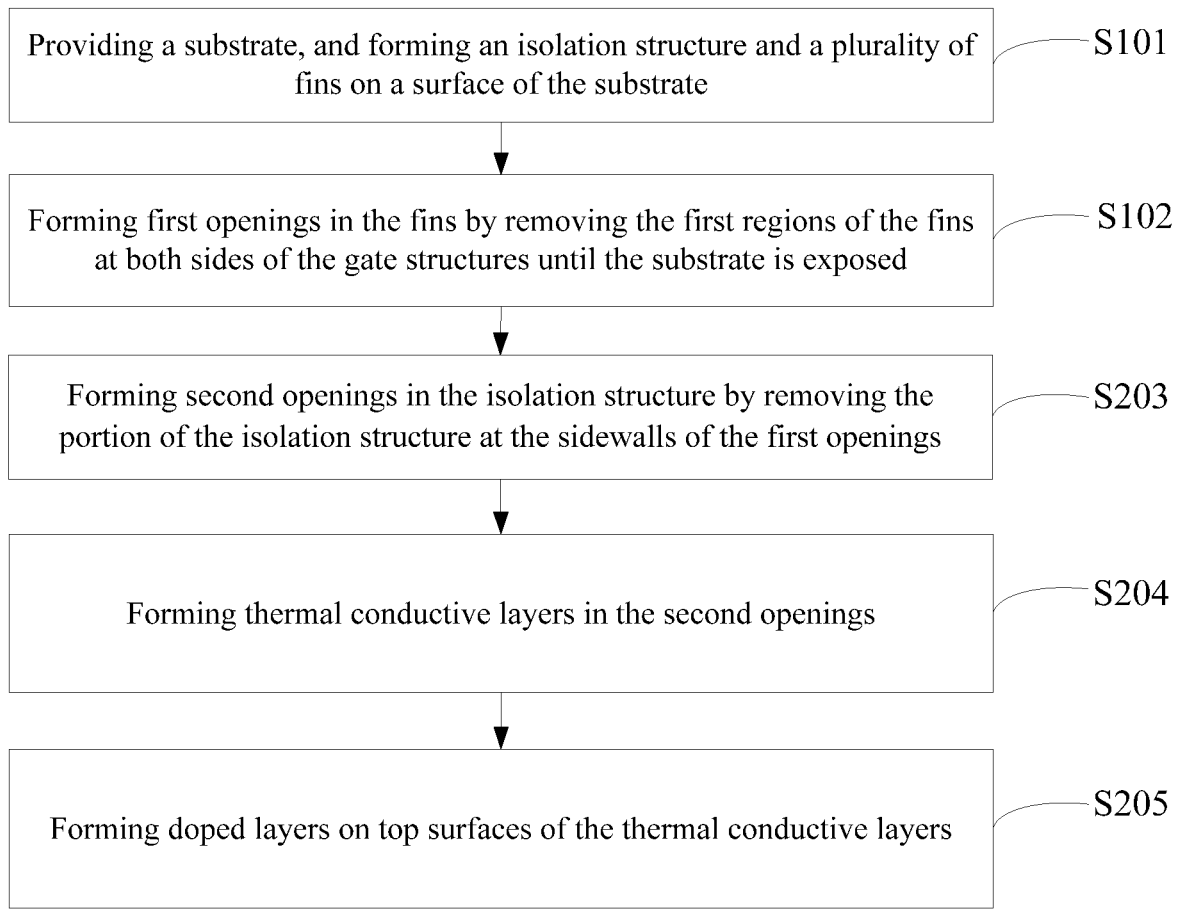
FIG. 15 illustrates another exemplary fabrication process of a semiconductor structure consistent with the disclosed embodiments.

FIG. 15 illustrates another exemplary fabrication process of a semiconductor structure consistent with the disclosed embodiments; and FIGS. 2-6 and FIGS. 10-13 illustrate semiconductor structures corresponding to certain stages of the exemplary fabrication process.

Figure 10:
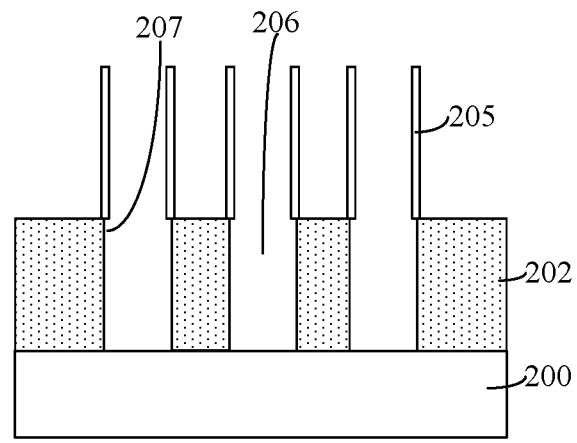

As shown in FIG. 15, after S101 and S102 are performed, by removing the portion of the isolation structure 202 at the sidewalls of the first openings 206, second openings 207 are formed in the isolation structure 202 (S203). FIG. 10 illustrates a corresponding semiconductor structure.

As shown in FIG. 10, the second openings 207 are connected with their corresponding first openings 206. It should be noted that FIG. 10 and FIG. 6 correspond to a same cross-sectional direction.

In one embodiment, after the first openings 206 are formed, a portion of the isolation structure 202 at the sidewalls of the first openings 206 are removed to form the second openings 207. Both the first openings 206 and the second openings 207 are used to subsequently accommodate the thermal conductive layers.

In some other embodiments, the second openings are not formed, and only the first openings are formed. In this case, only the first openings are used to subsequently accommodate the thermal conductive layers.

The process of removing the portion of the isolation structure 202 at the sidewalls of the first openings 206 includes a wet etching process.

As the portion of the isolation structure 202 at the sidewalls of the first openings 206 is removed, the sum of the sizes of one second opening 207 and one first opening 206, in the direction perpendicular to the extending direction of the fins 201, is larger than the size of one first opening 206. Therefore, the subsequent thermal conductive layer located in the second opening 207 and the first opening 206 has a larger contact area with the substrate 200. Therefore, the thermal conductive layer may easily transfer the heat, generated by the operation of the transistor, to the substrate 200, and thus may reduce the self-heating effect.

The sum of the sizes of one second opening 207 and one first opening 206 in the direction perpendicular to the extending direction of the fins 201 is in a range of approximately 12 nm to 30 nm. If the sum of the sizes of one second opening 207 and one first opening 206 in the direction perpendicular to the extending direction of the fins 201 is less than 12 nm, the subsequent thermal conductive layer, located in the second opening 207 and the first opening 206, has a small contact area with the substrate 200. The capability of the thermal conducting layer to transmit the heat generated by the operation of the transistor to the substrate 200 is weak, and thus the self-heating effect of the transistor may be serious. If the sum of the sizes of one second opening 207 and one first opening 206 in the direction perpendicular to the extending direction of the fins 201 is larger than 30 nanometers, the isolation structure 202 at the bottom of the side walls 205 at the first regions I may be removed excessively. In this case, the sidewalls 205 at first regions I are prone to tilting. When epitaxial layers are formed on the surfaces of the thermal conductive layers, the morphology of the epitaxial layers are not restricted. In this case, adjacent epitaxial layers may contact with each other, and the performance of the semiconductor device cannot be improved.

The second openings 207 and the first openings 206 are used to subsequently accommodate the thermal conductive layers.

Figure 11:
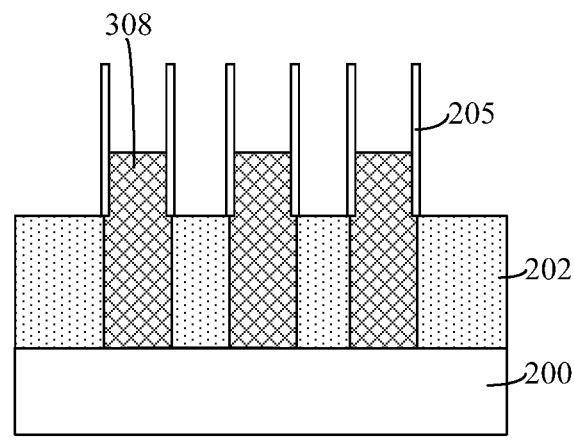

Referring to FIG. 11, thermal conductive material films 308 are formed in the second openings 207. The thermal conductive material films 308 have a second thermal conductivity, and the second thermal conductivity is larger than the first thermal conductivity.

In one embodiment, the material of the thermal conductive material films 308 is silicon. The forming process of the thermal conductive material films 308 includes an epitaxial growth process. In some other embodiments, the material of the thermal conductive material film may be silicon carbide.

In one embodiment, the thermal conductive material films 308 cover a portion of the surfaces of the sidewalls 205. The sidewalls 205 are used to limit the topography of the thermal conductive material films 308 during the epitaxial growth process.

The thermal conductive material films 308 are used for subsequently forming thermal conductive layers. As the second thermal conductivity of the thermal conductive layers is larger than the first thermal conductivity of the fins 201, the thermal conductive layers have a strong capability of transmitting the heat generated by the operation of the transistor to the substrate 200. Therefore, this configuration may reduce the self-heating effect of the transistor.

Moreover, as the sum of the sizes of one second opening 207 and one first opening 206 in the direction perpendicular to the extending direction of the fins 201 is large, the thermal conductive material films 308, located in the second openings 207 and the first openings 206, has a large contact area with the substrate 200. As the thermal conductive material films 308 are used to form the thermal conductive layers, the bottoms of the thermal conductive layers have a large contact area with the substrate 200. Therefore, in this configuration, the heat generated by the transistor may be easily transferred to the substrate 200, and the heat may be further transferred from the substrate 200 to the external environment. That is, this configuration may reduce the self-heating effect.

The thickness of the thermal conductive material films 308 is in a range of approximately 500 angstroms to 2000 angstroms.

Figure 12:
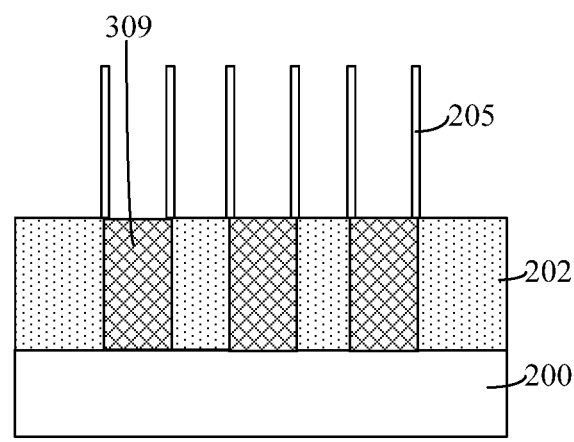

Returning to FIG. 15, after a portion of the thermal conductive material films 308 are removed, thermal conductive layers 309 are formed in the second openings (S204). FIG. 12 illustrates a corresponding semiconductor structure.

The process of removing a portion of the thermal conductive material films 308 includes one or a combination of a dry etching process and a wet etching process.

Since a portion of the thermal conductive material films 308 is removed, the volume of the source/drain doped regions formed on the surfaces of the thermal conductive layers 309 is large. Therefore, the source/drain doped regions have a large stress on the carriers at the channel regions, and may thus improve the mobility of the carriers.

As the thermal conductive layers 309 are formed from the thermal conductive material films 308, the thermal conductivity of the thermal conductive layers 309 is larger than the thermal conductivity of the fins 201, so the thermal conductive layers 309 have a strong capability to transfer the heat generated by the operation of the transistor. Therefore, this configuration may reduce the self-heating effect of the transistor, and improve the performance of the device.

Moreover, as the sum of the sizes of one second opening 207 and one first opening 206 in the direction perpendicular to the extending direction of the fins 201 is large, the thermal conductive layers 309, located in the first openings 206 and the second openings 207, have a large contact area with the substrate 200. Thus, the thermal conductive layers 309 have a strong capability to transfer the heat generated by the operation of the transistor to the substrate 200. Therefore, this configuration may further reduce the self-heating effect of the device, and improve the performance of the device.

The thickness of the thermal conductive layers 309 is in a range of approximately 500 angstroms to 2,000 angstroms. If the thickness of the thermal conductive layers 309 is less than 500 angstroms, the thermal conductive layer 309 may not have sufficient ability to transfer the heat generated by the transistor. In this case, the self-heating effect may be serious, and maybe the performance of the device cannot be improved. If the thickness of the heat conducting layers 309 is larger than 2,000 angstroms, to avoid the contact between subsequently formed adjacent doped layers, the volumes of the subsequently formed doped layers should be small. Therefore, the source/drain doped regions have a little stress on the carriers in the channel regions, and in this case, maybe the mobility of carriers cannot be improved.

In one embodiment, the top surfaces of the thermal conductive layers 309 are lower than the tops of the sidewalls 205 at the side of the first regions I of the fins 201. The sidewalls 205 at the top surfaces of the thermal conductive layers 309 may limit the morphology of the subsequent doped layers, so that the subsequent doping layers do not grow excessively. Therefore, the contact between adjacent doped layers may be avoided, and thus this configuration may improve the performance of the semiconductor device.

In some other embodiments, the top surfaces of the thermal conductive layers 309 may be higher than the tops of the sidewalls 205 at the side of the first regions I of the fin 201.

Figure 13:
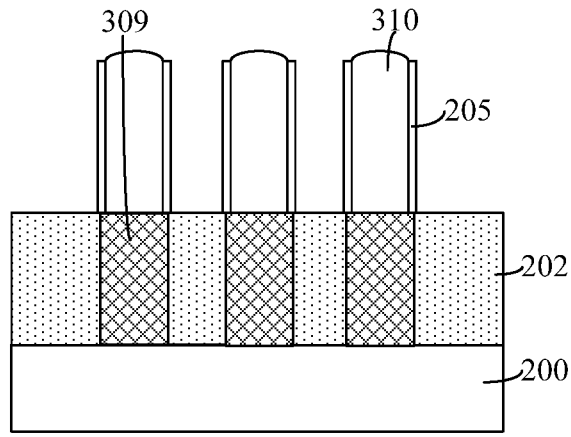

Returning to FIG. 15, doped layers 310 are formed on top surfaces of the thermal conductive layers 309 (S205). FIG. 13 illustrates a corresponding semiconductor structure.

As shown in FIG. 13, the topography of the doped layers 310 may be limited by the sidewalls 205. The forming process of the doped layers 310 includes forming epitaxial layers (not shown) on top surfaces of the thermal conductive layers 309, and doping source/drain ions into the epitaxial layers to form the doped layers 310.

In one embodiment, the transistor is a PMOS transistor. Therefore, the material of the epitaxial layers includes silicon germanium, and the source/drain ions are P-type ions, such as boron ions and $BF_2^+$ ions.

In some other embodiments, the transistor may be an NMOS transistor. Therefore, the material of the epitaxial layers includes silicon carbide, and the source/drain ions are N-type ions, such as phosphorus ions and arsenic ions.

The forming process of the epitaxial layers includes an epitaxial growth process.

In one embodiment, since the top surfaces of the thermal conductive layers 309 are lower than the sidewalls 205 at the side of the first regions I of the fins 201, the sidewalls 205 may limit the topography of the epitaxial layers during the formation of the epitaxial layers, and prevent the contact between adjacent epitaxial layers. Therefore, this configuration may improve the performance of the semiconductor device.

Correspondingly, the present disclosure provides a semiconductor structure. Referring to FIG. 13, the semiconductor structure includes a substrate 200, and fins 201 are disposed on the surface of the substrate (see FIG. 5). Along the extending direction of the fins 201, the fins 201 include second regions II and first regions I. The first regions I are located at both sides of the second regions II. Gate structures 203 are formed across the second regions II (see FIG. 5). The material of the fins 201 has a first thermal conductivity. First openings 206 (see FIG. 6) are formed at the first regions I located at both sides of the gate structures 203, and the bottom of the first openings 206 expose the surface of the substrate 200. Thermal conductive layers 209 are formed in the first openings 206, and the thermal conductive layers 209 have a second thermal conductivity. The second conductivity is larger than the first thermal conductivity. Doped layers 210 are formed on top surfaces of the thermal conductive layers 209.

The size of the first openings 206 in the extending direction of the fin 201 is in a range of approximately 8 nm to 20 nm.

The depth of the first openings 206 is in a range of approximately 800 angstroms to 3,000 angstroms.

If the transistor is a PMOS transistor, the material of the fins 201 includes silicon germanium. If the transistor is an NMOS transistor, the material of the fins 201 includes a compound of a group III-V element.

The material of the thermal conductive layers 209 includes silicon or silicon carbide, and the thickness of thermal conductive layers 209 is in a range of approximately 500 angstroms to 2000 angstroms.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A semiconductor structure, comprising:
   a substrate;
   a plurality of fins formed on a surface of the substrate, wherein, along an extending direction of the fins, the fins include first regions, second regions, and gate structures across the second regions; and the first regions are located at both sides of the second regions;
   an isolation structure formed on the surface of the substrate and between the adjacent fins;
   first openings formed at the first regions located at both sides of the gate structures, wherein the bottoms of the first openings expose the surface of the substrate;
   thermal conductive layers formed in the first openings; and
   doped layers formed on top surfaces of the thermal conductive layers,
   wherein a top surface of the thermal conductive layers is coplanar with the top surface of the isolation structure, a material of the fins has a first thermal conductivity, a material of the thermal conductive layers have a second thermal conductivity, a width of the thermal conductive layers is greater than a distance between adjacent fins in a direction perpendicular to an extension direction of the plurality of fins, and the second thermal conductivity is larger than the first thermal conductivity.

2. The semiconductor structure according to claim 1, wherein a size of the first openings in the extending direction of the fin is in a range of 8 nm to 20 nm.

3. The semiconductor structure according to claim 1, wherein a depth of the first openings is in a range of 800 angstroms to 3,000 angstroms.

4. The semiconductor structure according to claim 1, wherein the semiconductor structure is a PMOS transistor, and the material of the fins includes silicon germanium.

5. The semiconductor structure according to claim 1, wherein the semiconductor structure is an NMOS transistor, and the material of the fins includes a compound of a group III-V element.

6. The semiconductor structure according to claim 1, wherein:
 a material of the thermal conductive layers includes silicon; and
 a thickness of thermal conductive layers is in a range of 500 angstroms to 2,000 angstroms.

7. The semiconductor structure according to claim 1, wherein:
 a material of the thermal conductive layers includes silicon carbide; and
 a thickness of thermal conductive layers is in a range of approximately 500 angstroms to 2,000 angstroms.

8. The semiconductor structure according to claim 1, wherein:
 a bottom surface of the doped layers is coplanar with the top surface of the isolation structure.

* * * * *